United States Patent [19]
Cole

[11] Patent Number: 5,465,273
[45] Date of Patent: Nov. 7, 1995

[54] MODEM UTILIZING PARITY AND CONVOLUTIONAL ENCODER FEEDBACK

[75] Inventor: Paul D. Cole, Fairfield, Conn.

[73] Assignee: General DataComm, Inc., Middlebury, Conn.

[21] Appl. No.: 267,112

[22] Filed: Jun. 24, 1994

Related U.S. Application Data

[63] Continuation-in-part of Ser. No. 230,682, Apr. 20, 1994.
[51] Int. Cl.$^6$ .............................. H04L 5/12; H04L 23/02; H04K 1/02
[52] U.S. Cl. ..................... 375/296; 371/43; 375/265; 375/261; 332/103
[58] Field of Search ........................ 375/59, 8, 39; 371/43, 27

[56] References Cited

U.S. PATENT DOCUMENTS

| | | | |
|---|---|---|---|
| 4,024,342 | 5/1977 | Croiser et al. | 178/67 |
| 4,683,578 | 7/1987 | Betts et al. | 375/98 |
| 5,029,185 | 7/1991 | Wei | 375/27 |
| 5,164,963 | 11/1992 | Lawrence et al. | 375/39 |
| 5,195,107 | 3/1993 | Wei | 375/18 |
| 5,258,987 | 11/1993 | Wei | 371/43 |
| 5,301,209 | 4/1994 | Wei | 375/39 |
| 5,361,276 | 11/1994 | Subramanian | 375/99 |

Primary Examiner—Stephen Chin
Assistant Examiner—William Luther
Attorney, Agent, or Firm—David P. Gordon

[57] ABSTRACT

A modem is provided with a Trellis encoder which utilizes a double-branch feedback, with a first branch of the feedback including a convolutional encoder, and a second branch of the feedback including a parity generator which computes the parity of consecutive offsets. The Trellis encoder includes a four-dimensional (4D) mapper which generates pairs of 2D points u(k). Each point is offset by a value c(k) to obtain offset points y(k) which are then predistorted by a value p(k) to obtain an output x(k). The output x(k) is filtered to update the predistortion value p(k) which in turn is used to update the offset value c(k). The offset value c(k) is chosen from a 2D constellation lattice which is closest to the predistortion value p(k). The parity C0 of consecutive offset values c(k) is used in conjunction with a redundant bit output Y0 of a convolutional encoder to generate a rotational feedback bit input U0 to the 4D mapper, where the rotational bit input is the parity of two 2D points chosen by the mapper. The mapper uses bit U0 in generating the second of the pair of points u(k). The second point is likewise offset to obtain another offset value y(k), and then predistorted to obtain another output. Two offset values y(k) are used by the convolutional encoder to generate the next redundant bit output with is eventually used with the parity of the next two offset values to generate the next bit U0 for the second of the next pair of points.

20 Claims, 2 Drawing Sheets

MODEM UTILIZING PARITY AND CONVOLUTIONAL ENCODER FEEDBACK

This application is a continuation-in-part of co-assigned U.S. Ser. No. 08/230,682 entitled "Convolutional Encoders for Modems Which Implement the 'Cole Code'" which was filed on Apr. 20, 1994, and which is hereby incorporated herein in its entirety.

BACKGROUND OF THE INVENTION

1. Field of the Invention

The present invention relates generally to modems. More particularly, the present invention relates to V.34 type modems, a standard (Recommendation) TD-57 for which was recently adopted (Geneva 1–9 Jun., 1994) by the ITU-T (International Telecommunications Union—Telecommunications Standardization Sector) under the subtitle "A Modem Operating at Data Signalling Rates of Up to 28800 Bit/s for use on the General Switched Telephone Network and on Leased Point-to-Point 2-Wire Telephone-Type Circuits", which document is hereby incorporated by reference herein in its entirety.

2. State of the Art

It is well known in the modem arts how to increase the signal to noise ratio of a modem by encoding bits of data which are to be modulated and sent over a telecommunications channel. In the encoding of bits in the modem transmitter, it has become relatively standard to employ a Trellis encoder. The Trellis encoder (as defined herein) typically comprises a convolutional encoder and a mapper. The convolutional encoder is a state update machine which receives inputs and generates outputs as a function of the inputs and/or the state of the machine at the time. In addition to generating outputs, the state update machine updates its state. Generally, the outputs of the convolutional encoder number one more than the inputs, thereby providing a redundancy which helps increase the signal-to-noise ratio of the system. The mapper receives as inputs the outputs of the convolutional encoder as well as other bits, and maps those inputs to one or more constellation points from which modulated signals are generated. When the mapper generates a single x,y constellation point value from the inputs, the system is said to be a two dimensional (2D) system. When the mapper generates two x,y constellation point values from the inputs, the system is said to be a four dimensional (4D) system, with the concatenation of the two x,y constellation points constituting a single point in a 4D "constellation". In the V.34 standard, a 4D constellation is utilized.

In the case of 4D codes, the mapper inputs taken from the convolutional encoder are typically used to select a subset within a four dimensional (4D) constellation (i.e., the rotations of the two 2D points), where other mapper inputs select a 4D constellation point within the 4D subset. Because the convolutional encoder inserts a redundant bit, it doubles the number of 4D constellation points required for transmitting a given number of data bits per 4D point. The efficacy of Trellis encoding is based upon the premise that this redundancy penalty is exceeded substantially by an increased separation between the sequences of 4D points generated by the Trellis encoder. The convolutional encoder, which generates only some and not all possible sequences, provides this separation. The extent to which the separation provided by the convolutional encoder exceeds the redundancy penalty is the main measure of its performance with the Trellis encoder employing it.

Preferred Trellis codes, such as described in U.S. Pat. No. 4,713,817 to Wei (which is hereby incorporated by reference herein) have the following property, known as 90° rotational invariance: the 0°, 90°, 180°, and 270° rotation about the origin of any sequence of points generated by the Trellis encoder is itself a sequence of points generated by the Trellis encoder. In modem applications, rotational invariance is important because channel impairments can lead to phase ambiguities in the receiver. The rotations about the origin taking the thirty-two 4D subsets employed by the sixty-four state code to each other are 0°, 90°, 180°, 270°, and the same is true for the eight 4D subsets employed by the sixteen state code. So, a Trellis encoder employing of these collections of 4D subsets is rotationally invariant if and only if the convolutional encoder employed has the corresponding rotational invariance property.

Trellis codes which are improved over those of Wei are described in U.S. Pat. Nos. 5,260,971 to Cole and 5,291,520 to Cole which are hereby incorporated by reference herein. In those patents, a distribution preserving encoding is described where points u(k) (k being a time index for 2D points) chosen by a mapper are precoded according to a linear function which effectively incorporates a FIR filter and an offset means which utilizes an estimation which causes the predistorted outputs x(k) to either occupy the same defined regions in space as the points exiting the mapper or to approximate the point exiting the mapper. Thus, the points being transmitted x(k) are set equal to u(k)+q(k)−p(k), where u(k) is a point from the 2D constellation, p(k) is defined according to p(k)=h(1)×(k−1)+h(2)×(k−2)+..., where h(n) for n=1,2... represents the impulse response of FIR filter and q(k) is picked from points in a 2D lattice closest to p. The points q(k) are chosen in this manner so that the coset(u+q) is equal to coset(u) in order to provide a valid coded sequence for the Viterbi decoder in the receiver. The estimation is chosen so that the power of the output x(k) on average is approximately equal to the power of the points u(k) exiting the mapper.

In an article by Rajiv Laroia entitled "ISI Coder—Combined Coding and Precoding" submitted to Technical Subcommittee TR30.1 on June 14–18 Baltimore, which is hereby incorporated by reference herein, the concept of using the convolutional encoder in a feedback loop of a Trellis encoder was disclosed. The feedback loop is used in order to guarantee that the parity of a pair of offset points generated by a mapper and then offset, and from which bits are derived for input into the convolutional encoder, is equal to the value of the redundant bit Y0 which is determined by the state of the convolutional encoder. In particular, and as shown in the prior art FIG. 1 which is effectively a redrawing of Laroia's Figure 1, Laroia has a Trellis or ISI encoder 15 which uses a 4D mapper 21 to dictate early and late points u(k) of a 4D point. Rotational bits (U3, U2, U1, and U0) for the two 2D points are typically obtained at least in part from a differential encoder 35, while a shell mapper 37 is typically used to generate yet other bits for the 4D mapper. It should be noted that Laroia sets U0 to zero.

The points u(k) output by the 4D mapper 21 of Laroia are subjected to offset by the addition of q(k) at summer 23, and predistortion by the subtraction of p(k) at summer 25, where the output of the modem x(k) is defined according to u(k)+q(k)−p(k)=x(k). The outputs x(k) are fed back through an FIR filter 27 to generate values p(k). The pair of sums of u(k)+q(k) for two consecutive points are fed through a bit extractor 31 and convolutional encoder 33 which generates the next value of the redundant bit Y0. The redundant bit Y0 generated by the convolutional encoder 33, and the predistortion value p(k) generated by the filter 27 are provided to the offset point picker 29 which picks an offset q(k). The offset q(k) is chosen from either of two cosets of a 4D parity lattice, where the coset is chosen by the value of Y0, and the point in the coset is chosen to be closest to the predistortion value p(k). In this manner, the offsets q(k) for a pair of points u(k) can be chosen to guarantee that the parity of the offset points y(k)=u(k)+p(k) is equal to Y0. In other words, the offset point picker 29 of Laroia must adjust q(k) such that u(k)+q(k), when subjected to bit extraction, will generate an appropriate Y0 bit value. This requirement introduces various limitations on the system which affect its performance. One limitation is that the resulting system is not rotationally invariant. Another limitation is that the offset points picked are chosen from a coset of a 4D parity lattice which is a subset of the 4D constellation lattice; and this limits the points which can be chosen. A third limitation is that by the forced adjustment of q(k), p(k) may not be closely estimated by q(k), which would result in the output x(k) having a different power than chosen points u(k). Thus, while a system incorporating the convolutional encoder in a feedback loop has certain desirable results, the system proposed by Laroia has several undesirable traits which adversely impact its performance.

SUMMARY OF THE INVENTION

It is therefore an object of the invention to provide a modem which has a rotationally invariant Trellis encoder which utilizes convolutional encoder feedback to the mapper.

It is another object of the invention to provide a rotationally invariant Trellis encoder with convolutional encoder feedback to the mapper for use in the V.34 standard.

It is a further object of the invention to provide a Trellis encoder which utilizes parity feedback as well as convolutional encoder feedback to the mapper to provide a rotationally invariant system where the power of the predistorted output points is approximately equal to the power of the points exiting the mapper.

It is an additional object of the invention to provide a Trellis encoder with convolutional encoder feedback and parity feedback to the mapper which permits an offset applied to a point value exiting the mapper to be a point in the 2D constellation lattice which is closest to a predistortion value determined by an FIR filter.

In accord with the objects of the invention a modem is provided with a Trellis encoder which includes a mapper, offset means and predistorting means for offsetting and predistorting constellation points chosen by the mapper, convolutional encoder means for receiving offset points and providing therefrom at least one bit (Y0), and parity means for computing the parity of consecutive offsets. The parity and the convolutional encoder bit are used to generate a rotational feedback bit input to the 4D mapper, where the rotational bit input is the parity of two 2D points chosen by the mapper. Typically, the predistorting means is an FIR filter which is coupled to the output of the modem. The FIR filter provides a predistorting value p(k) to the offset means which chooses a point in the 2D constellation lattice c(k) which is closest to the predistortion value to constitute the offset. Thus, the offset c(k) is added to the output from the mapper u(k) to form a sum y(k), which when predistorted with value p(k), such as by subtracting p(k) from y(k), provides the output x(k). The sum y(k) is sent to the convolutional encoder means which extracts bits for encoding. The result of the convolutional encoding is a bit which is added (modulo two) to the parity C0 of two values of c(k) in order to provide the rotational bit input U0. The resulting Trellis encoder is rotationally invariant, and the power of the predistorted offset output point x(k) is approximately equal to the power of the point u(k) exiting the mapper as the offset c(k) applied to a point exiting the mapper is a point in the 2D constellation lattice which is closest to a predistortion value p(k) determined by the FIR filter.

The Trellis encoder functions according to a preferred sequence. The preferred sequence starts where the first (u(0)) of the two 2D points chosen by the mapper is offset (by c(0) to provide y(0)) and predistorted (by p(0)) to provide a first output x(0). The first output is taken by the filter which updates the predistortion value to p(1) which in turn is used to update the offset to c(1). The parity (C0) of values c(0) and c(1) is computed and added to the output (Y0) of the convolutional encoder, which is known at the start of the sequence, to provide as feedback a rotational bit (U0) to the mapper. At the same time, the offset value y(0) is provided to the convolutional encoder. The mapper uses the rotational bit (U0) to generate the second (u(1)) of the two 2D points. The sequence then continues by offsetting the second 2D point by c(1) to obtain y(1) and predistorting the offset value y(1) by p(1) to provide a second output x(1). The second output is taken by the filter which updates the predistortion value to p(2) which in turn is used to update the offset to c(2). The value c(2) is stored for a later parity determination in conjunction with value c(3). The y(1) value is provided to the convolutional encoder, which in conjunction with the value y(0) generates an updated output Y0. The sequence then repeats itself with a first of a new set of two 2D points being chosen by the mapper, being offset (by c(2) to provide y(2)) and predistorted by p(2)) to provide an output x(2), etc.

According to preferred aspects of the invention, the mapper is provided with a plurality of bits, including bits from a shell or ring mapper such as described in co-owned U.S. Pat. No. 5,048,056 to Goldstein, and four rotational bits (U3, U2, U1, U0), where bits U3 and U2 are generated by a differential encoder, and bit U0 is the feedback bit generated as described above. Further, the convolutional encoder is preferably such as described in the parent application hereto, U.S. Ser. No. 08/230,682. Also, the parity of the two offsets c(k) can be generated either by dividing the 2D lattice into "odd parity" and "even parity" points and taking the exclusive OR (XOR) of the two, or by looking at the rotation of the offsets in the 2D lattice and taking the XOR of the mod 2 of the ninety degree multiples of the rotation.

Additional objects and advantages of the invention will become apparent to those skilled in the art upon reference to the detailed description taken in conjunction with the provided figures.

DETAILED DESCRIPTION OF THE PREFERRED EMBODIMENT

Figure 1:
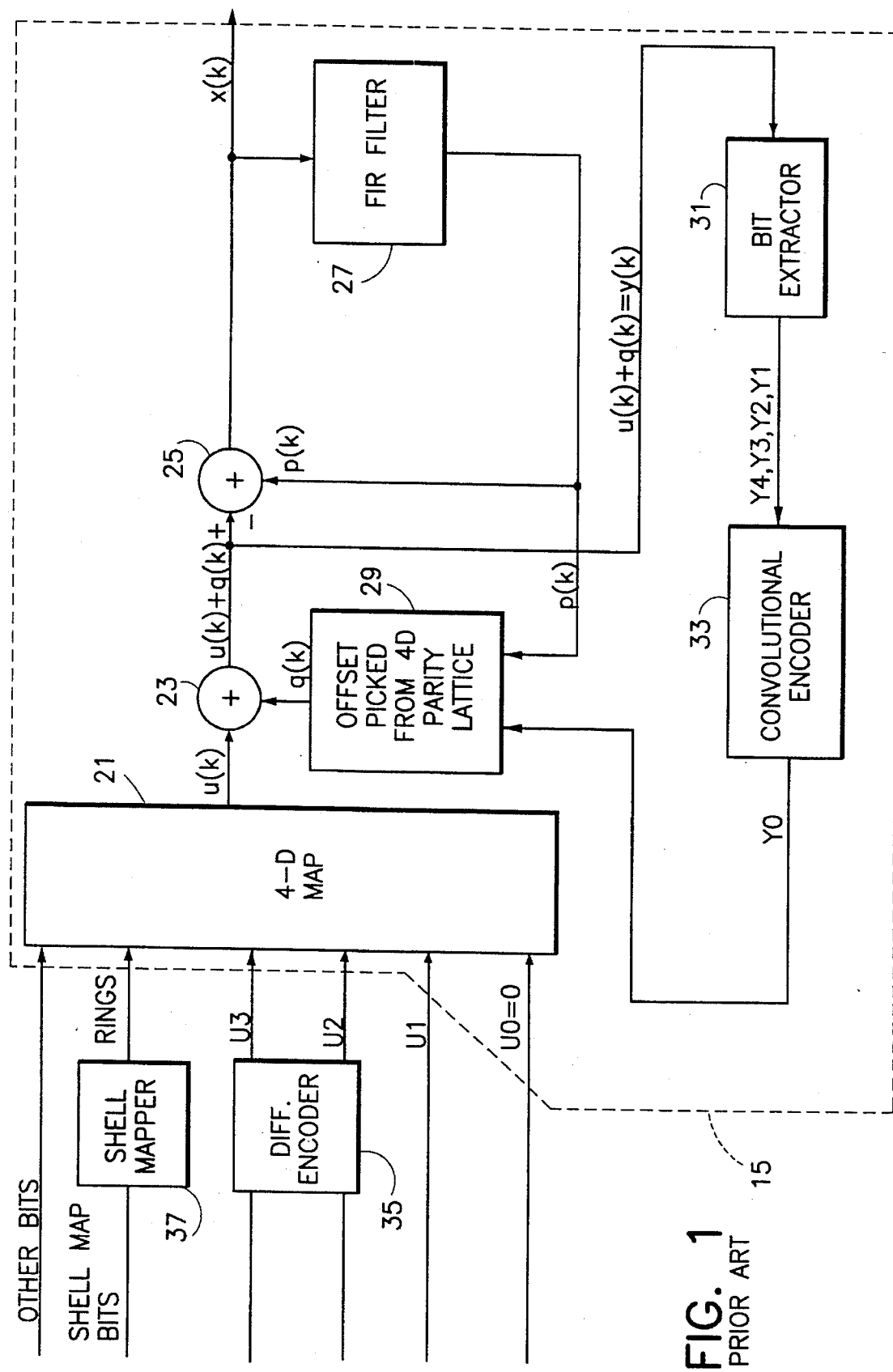
FIG. 1 is a prior art block diagram of a Trellis encoder utilizing feedback from a convolutional encoder.
Figure 2:
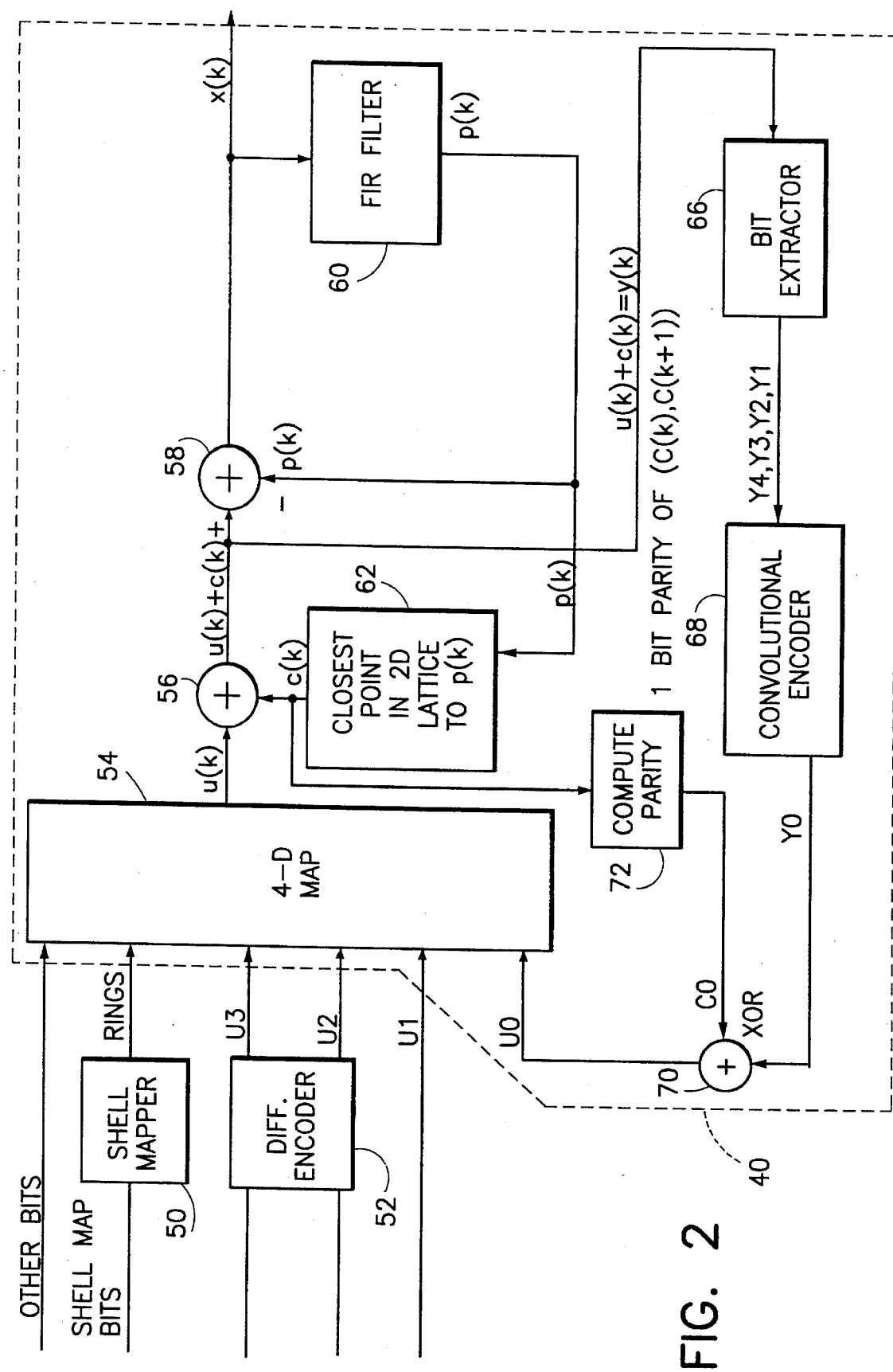
FIG. 2 is a block diagram of the Trellis encoder of the invention which utilizes feedback from a convolutional encoder and from a parity of chosen offsets.

Before turning to FIG. 2, some background regarding terminology and modem coding is useful. In generating signals for sending over a telecommunications channel, a modem typically uses a plurality of bits which are used to choose one or more points in a constellation lattice. A 2D constellation lattice L may be defined according to:

$$L = 2Z, 2Z = \{(2a, 2b): a \text{ and } b \text{ are integers}\} \quad (1)$$

where Z is the set of all integers. A constellation grid G which is effectively an offset of the lattice is accordingly defined as:

$$G = (2Z+1), (2Z+1) = \{(2a+1, 2b+1): a \text{ and } b \text{ are integers}\} \quad (2)$$

A parity sublattice K may be defined as:

$$K = \{(2a, 2b) \text{ in } L: a+b \equiv 0 \text{ mod } 2\} \quad (3)$$

For 2D points $t_0$ and $t_1$ in grid G, or $t_0$ and $t_1$ in lattice L, the parity of the 4D point $(t_0, t_1)$ is defined by:

$$(4)$$

Since an odd integer is congruent to either 1 or −1 mod 4, the grid G can be easily decomposed into four cosets of 2L=4Z,4Z, where: 4Z,4Z+(1,1) is called coset 0; 4Z,4Z+(1,−1) is called coset 1; 4Z,4Z+(−1,−1) is called coset 2; and 4Z,4Z+(−1,1) is called coset 3. This is called the four-way partitioning of grid G. It will be appreciated that coset m is the m.90° clockwise rotation of coset 0. It will also be appreciated that for points $t_0$ and $t_1$ in the grid G, with $t_0$ in coset $m_0$ and $t_1$ in coset $m_1$, the parity of the 4D point $(t_0, t_1)$ is $m_0+m_1$ mod 2.

In the case of 4D codes, the mapper inputs taken from the convolutional encoder select a defined subset within the 4D constellation; the 4D constellation being the Cartesian product of the 2D constellation with itself. The other mapper inputs select a 4D constellation point within the 4D subset. These 4D subsets are predefined in terms of partitionings of the 2D constellation points, with a sixteen state code (such as described in the Wei U.S. Pat. No. 4,713,817) employing eight 4D subsets derived from the four-way 2D partitioning, and a sixty-four state code (such as described in the Wei U.S. Pat. No. 4,713,817 or in U.S. Ser, No. 08/230,682 to Cole) employing thirty-two 4D subsets derived from an eight-way 2D partitioning obtained by splitting each set in the four-way partitioning. The eight 4D subsets employed by the sixteen state code are obtained by pairing the sixteen Cartesian products of cosets 0, 1, 2, and 3 and may be labeled by three bit words. The thirty-two 4D subsets employed by the sixty-four state code are obtained by splitting the four cosets into eight cosets, and pairing the sixty-four Cartesian products of the eight cosets. The thirty-two 4D subsets may be labeled by five bit words.

In selecting a subset for a 4D point, a coset must be selected for each of two points in each of two copies of constellation grid G. The first point is selected to be in coset $m_0$, where $m_0$ is determined using bits U3 and U2 according to:

$$m_0 = 2U3 + U2 \quad (5),$$

The second point is selected to be in coset $m_1$, where $m_1$ is determined using bits U3, U2, U1 and U0 according to:

$$m_1 = [2U3 + U2 + 2U1 + U0] \text{ mod } 4 \quad (6)$$

The preferred embodiment of the Trellis or ISI encoder 40 of the invention (as broadly defined) is seen in FIG. 2. The Trellis encoder 40 broadly includes a 4D mapper 54, summers 56 and 58, a FIR filter 60, an offset determination means 62, a bit extractor 66, a convolutional encoder 68, a parity computation means 72, and a mod 2 summer 70. As will be appreciated by those skilled in the art, the 4D mapper 54 is provided with a plurality of bits. Some of the bits provided to the 4D mapper 54 are preferably generated by a shell mapper 50, which is preferably of a type such as taught in U.S. Pat. No. 5,048,056 to Goldstein. Others of the bits (preferably U3 and U2) are preferably provided by a differential encoder 52 as is known in the art. One bit U0 is preferably provided by the Trellis encoder itself as feedback as is described in detail hereinafter. Based on the received bits, the mapper 54 provides a serial stream of 2D points u(k), with pairs of the serial stream constituting 4D points. Bits U3 and U2 are preferably used in determining the rotation (i.e., coset) of a first of the pair of 2D points according to equation (5) above, while bits U3, U2, U1 and U0 are used for choosing the rotation (i.e., coset) of a second of the pair of 2D points according to equation (6) set forth above.

The 2D points u(k) generated by the mapper are processed by offsetting the points and predistorting the offset points. In particular, offsets c(k) which are chosen from points of the 2D lattice are added at adder 56 to the point u(k) to provide offset points y(k)=u(k)+c(k) which are utilized as discussed below. At adder 58, complex numbers or points p(k) which represent predistortion are subtracted from the offset points y(k) to provide outputs x(k) which are modulated and converted for output on a telecommunications channel by the modem incorporating the Trellis encoder 40. In addition, the outputs x(k) are sent to a delay line which is preferably realized as an FIR filter 60. The outputs of the delay line 60 are taken as the predistortion values p(k), and the closest points in the 2D lattice to p(k) are taken as c(k) at 62 and fed back to the adder or summing means 56.

The Trellis encoder 40 of the invention utilizes a double-branched feedback loop for the 4D mapper. As seen in FIG. 2, a first branch of the feedback loop involves the convolutional encoder 68. Offset points y(k) are taken in pairs at bit extractor 66 which generates from two y(k) offset points the inputs Y4, Y3, Y2, and Y1 to the convolutional encoder 68. The convolutional encoder 68 may take any of numerous forms such as disclosed in parent application U.S. Ser. No. 08/230,682 or in ITU-T Recommendation TD-57. Regardless, the output from the convolutional encoder 68 includes the output Y0 which is determined by the state of the convolutional encoder. The second branch of the feedback loop involves the offsets c(k). As seen in FIG. 2, the parity value C0 of consecutive offset values is generated by the parity computation means 72. The parity computation means preferably generates the parity value C0 by looking at the 2D lattice from which the c(k), offsets are chosen as including "odd parity" (i.e., not in parity lattice K) and "even parity" (i.e., in lattice K) points, and obtaining the parity by taking the exclusive OR (XOR) of the two. Alternatively, the parity computation means can look at the rotation of each offset c(k) in a 2D lattice and take the XOR of the mod 2 of the ninety degree multiples of the rotation; i.e., 0° and 180° are taken as zero, while 90° and 270° are taken as one.

The two branches of the feedback loop are joined at the mod 2 summer 70 (which is preferably realized as an XOR gate), where the parity value C0 is added to the convolutional encoder output Y0. The result is fed back as an input bit U0 to the 4D mapper 54 and helps generate the rotation of the second point of the pair of 2D points generated by the 4D mapper 54 relative to the first point of the pair.

The Trellis encoder 40 of the invention functions according to a preferred sequence. The preferred sequence starts where the first (u(0)) of the two 2D points chosen by the 4D mapper 54 is offset at summer 56 by an offset c(0) in the 2D constellation lattice to provide an offset point y(0). The offset point y(0), which is provided to the bit extractor 66 as discussed in more detail below, is also predistorted at summer 58 by a predistortion value p(0) to provide a first output x(0). The first output x(0) is taken by the filter 60 which updates the predistortion value to p(1). The updated predistortion value is fed to the offset determination means 62 which chooses an offset c(1) in the 2D constellation lattice closest to the predistortion value p(1). The parity ($C0_{0,1}$) of values c(0) and c(1) is then computed by the parity computation means 72, and added at modulo two adder 70 to the output (Y0) of the convolutional encoder 68, which is known at the start of the sequence, to provide as feedback a rotational bit ($U0_1$) to the 4D mapper 54.

The 4D mapper 54 uses the rotational bit ($U0_1$) to generate the second (u(1)) of the two 2D points. The second 2D point u(1) is offset at adder 56 by the updated offset c(1) to obtain an offset point y(1). The offset point y(1) is fed to the bit extractor 66 as discussed in more detail below, and is also predistorted at 58 by the predistortion value p(1) to provide a second output x(1). The second output x(1) is used by the FIR filter 60 to update the predistortion value to p(2). The updated predistortion value p(2) is provided to the offset determination means 62 which chooses a new offset c(2) which is a point in the 2D constellation lattice closest to the predistortion value p(2). The value c(2) is stored in the parity computation means 72 for a later parity determination ($C0_{2,3}$) in conjunction with an offset value c(3).

As indicated above, both offset points y(0) and y(1) are provided to the bit extractor 66. Upon obtaining both values, the bit extractor 66 extracts bits Y4, Y3, Y2, and Y1 as inputs to the convolutional encoder 68 in a manner known in the art. The convolutional encoder, in turn, generates an updated output Y0 (alternatively named $Y0_{0,1}$) which will be used in conjunction with the parity determination $C0_{2,3}$ in generating a new feedback rotation bit $U0_3$ which is used in generating u(3). It will be appreciated that the feedback rotation bit U0 is only generated for the second 2D point (e.g., $U0_1$, $U0_3$, $U0_5$ . . . ) of the u(k) pairs.

The sequence of the invention then repeats itself. Briefly, a first (u(2)) of a new set of two 2D points is chosen by the 4D mapper. Point u(2) is offset by the offset value c(2) to provide an offset point y(2) which is sent to the bit extractor. The offset point y(2) is also predistorted by p(2)) to provide an output x(2). The output x(2) is used to generate an updated predistortion value p(3), which is used to generate a new offset c(3). The offset c(3) is used in conjunction with offset c(2) to generate a parity bit $C0_{2,3}$. The parity bit $C0_{2,3}$ is summed by the mod 2 summer 70 with the output $Y0_{0,1}$ of the convolutional encoder to provide feedback rotation bit $U0_3$. The feedback rotation bit $U0_3$ is used in generating point u(3) which is offset by c(3) to generate y(3); which in turn is predistorted by p(3) to generate output x(3). The predistortion p(3) and offset c(3) are updated, and y(3) is sent to the bit extractor which extracts four bits from y(2) and y(3). The four bits are sent to the convolutional encoder which generates $Y0_{2,3}$ for later use with $C0_{4,5}$. The sequence then repeats.

There has been illustrated and described herein a modem having a Trellis encoder which utilizes parity and convolutional encoder feedback. While particular embodiments have been described, it is not intended that the invention be limited thereto, as it is intended that the invention be as broad in scope as the art will allow and that the specification be read likewise. Thus, while a particularly preferred delay line, convolutional encoder, and mod 2 summing means were described, it will be appreciated that other arrangements which perform substantially the same function could be utilized. Also, while inputs to the 4D mapper were defined as being generated by a shell mapper and differential encoders, it will be appreciated the inputs could be generated in any of several different manners, and shell or ring mappers and differential encoders are not absolutely necessary. Further, it will be appreciated that various enhancements to the invention as disclosed in ITU-T Recommendation TD-57 can be utilized in conjunction with the invention. Thus, a rounder can be used in conjunction with the filter, where the rounder rounds the real and imaginary components of a predistortion value generated by the filter to the nearest integer multiples of $2^{-7}$ to obtain the predistortion value p(k) utilized herein. Likewise, a bit (V0) which represents bit inversions for purposes of superframe synchronization can be added to C0 and Y0 at the mod 2 summing means. It will therefore be appreciated by those skilled in the art that yet other modifications could be made to the provided invention without deviating from its spirit and scope as so claimed.

I claim:

1. A modem transmitter, comprising:

a) a four-dimensional (4D) mapper for generating pairs of two-dimensional (2D) points in a 2D constellation grid, said 4D mapper having means for receiving a plurality of bit inputs, at least one of said plurality of bit inputs being a rotation-defining bit which helps define a rotation of a point generated by said 4D mapper;

b) offset means for offsetting said 2D points generated by said 4D mapper by values c(k) in a 2D constellation lattice, to obtain offset points y(k), where k is a time index for said 2D points;

c) predistortion means for predistorting said offset points y(k) by values p(k) to obtain predistorted outputs x(k), wherein said predistortion means provides said values p(k) to said offset means, and said offset means chooses said values c(k) based on said values p(k);

d) convolutional encoder means for receiving said offset points y(k) as inputs, and determining therefrom at least one bit value Y0;

e) parity computation means for receiving said values c(k) as inputs from said offset means, and generating a parity bit value of two consecutive values c(k); and f) means for using said parity bit value and said bit value Y0 to generate said rotation-defining bit.

2. A modem transmitter according to claim 1, wherein:

said offset means chooses said values c(k) to be the closest points in said constellation lattice to values p(k).

3. A modem transmitter according to claim 1, wherein:

said rotation-defining bit defines a parity of said pair of 2D points.

4. A modem transmitter according to claim 1, wherein:

said convolutional encoder means comprises a bit extractor means for extracting a plurality of bits from a pair of offset points y(k), and a convolutional encoder which receives said plurality of bits extracted by said bit extractor and generates a redundant bit having said bit value Y0.

5. A modem transmitter according to claim 1, wherein:

said parity bit computation means generates said parity value by using rotation information of consecutive offsets c(k) in said constellation lattice.

6. A modem transmitter according to claim 1, wherein:

said means for using said parity bit value is a modulo 2 adder means.

7. A modem transmitter according to claim 1, wherein:

said parity bit computation means generates said parity value by assigning points in said constellation lattice as having odd parity and even parity, and by using the parities of respective assigned points relating to said consecutive offsets c(k).

8. A modem transmitter according to claim 1, wherein:

a first (u(0)) of a pair of 2D points is offset by an offset value c(0) provided by said offset means to obtain a first offset point y(0), said first offset point y(0) is provided to said convolutional encoder means, said first offset point y(0) is predistorted by a predistortion value p(0) by said predistortion means to provide a first predistorted output x(0);

said first predistorted output x(0) is used to update said predistortion means which generates a second predistortion value p(1), said second predistortion value is used by said offset means to generate a second offset value c(1), said first offset value c(0) and said second offset value c(1) are used by said parity computation means to generate a parity bit value $C0_{0,1}$, said parity bit value $C0_{0,1}$ is used by said means for using said parity bit value which generates a rotation-defining bit $U0_1$ and said rotation-defining bit $U0_1$ is used in generating a second (u(1)) in said pair of 2D points.

9. A modem transmitter according to claim 8, wherein:

said second (u(1)) of said pair of 2D points is offset by said second offset value c(1) provided by said offset means to obtain a second offset point y(1), said second offset point y(1) is provided to said convolutional encoder means, said second offset point y(1) is predistorted by said second predistortion value p(1) by said predistortion means to provide a second predistorted output x(1);

said second predistorted output x(1) is used to update said predistortion means which generates a third predistortion value p(2), said third predistortion value is used by said offset means to generate a third offset value c(2), and said first offset point y(0) and said second offset point y(1) are used by said convolutional encoder to provide a redundant bit $Y0_{0,1}$ which is fed to said means for using said parity bit value.

10. A modem transmitter according to claim 9, wherein:

a first (u(2)) of another pair of 2D points is offset by said third offset value c(2) provided by said offset means to obtain a third offset point y(2), said third offset point y(2) is provided to said convolutional encoder means, said third offset point y(2) is predistorted by said third predistortion value p(2) by said predistortion means to provide a third predistorted output x(2);

said third predistorted output x(2) is used to update said predistortion means which generates a fourth predistortion value p(3), said fourth predistortion value is used by said offset means to generate a fourth offset value c(3), said third offset value c(2) and said fourth offset value c(3) are used by said parity computation means to generate a parity bit value $C0_{2,3}$, said parity bit value $C0_{2,3}$ is used by said means for using said parity bit value which generates a rotation-defining bit $U0_3$ and said rotation-defining bit $U0_3$ is used in generating a second (u(0)) in said another pair of 2D points.

11. A modem transmitter, comprising:

a) a four-dimensional (4D) mapper for generating pairs of two-dimensional (2D) points in a 2D constellation grid, said 4D mapper having means for receiving a plurality of bit inputs, at least one of said plurality of bit inputs being a rotation-defining bit which helps define a rotation of a point generated by said 4D mapper;

b) offset means for offsetting said 2D points generated by said 4D mapper by values c(k) in a 2D constellation lattice, to obtain offset points y(k), where k is a time index for said 2D points, said offset means including means for choosing values c(k) in a 2D constellation lattice and means for offsetting 2D points by said chosen values c(k);

c) predistortion means for predistorting said offset points y(k) by values p(k) to obtain predistorted outputs x(k), wherein said predistortion means provides said values p(k) to said offset means, and said offset means chooses said values c(k) based on said values p(k);

d) convolutional encoder means for receiving said offset points y(k) as inputs, and determining therefrom at least one bit value Y0;

e) parity computation means for receiving said values c(k) as inputs from said means for choosing values c(k), and generating a parity bit value of two consecutive values c(k); and f) means for using said parity bit value and said bit value Y0 to generate said rotation-defining bit.

12. A modem transmitter according to claim 11, wherein:

said offset means chooses said values c(k) to be the closest points in said constellation lattice to values p(k).

13. A modem transmitter according to claim 11, wherein:

said rotation-defining bit defines a parity of said pair of 2D points.

14. A modem transmitter according to claim 11, wherein:

said convolutional encoder means comprises a bit extractor means for extracting a plurality of bits from a pair of offset points y(k), said convolutional encoder means generating a redundant bit having said bit value Y0 from said plurality of bits extracted by said bit extractor.

15. A modem transmitter according to claim 11, wherein:

said parity computation means generates said parity bit value by using rotation information of consecutive offsets c(k) in said constellation lattice.

16. A modem transmitter according to claim 11, wherein:

said means for using said parity bit value is a modulo 2 adder means.

17. A modem transmitter according to claim 11, wherein:

said parity computation means generates said parity bit value by assigning points in said constellation lattice as having odd parity and even parity, and by using the parities of respective assigned points relating to said consecutive offsets c(k).

18. A modem transmitter according to claim 11, wherein:

a first (u(0)) of a pair of 2D points is offset by an offset value c(0) provided by said offset means to obtain a first offset point y(0), said first offset point $y(0)$ is provided to said convolutional encoder means, said first offset point $y(0)$ is predistorted by a predistortion value $p(0)$ by said predistortion means to provide a first predistorted output $x(0)$, said first predistorted output $x(0)$ is used to update said predistortion means which generates a second predistortion value $p(1)$, said second predistortion value is used by said offset means to choose a second offset value $c(1)$, said first offset value $c(0)$ and said second offset value $c(1)$ are used by said parity computation means to generate a parity bit value $C0_{0,1}$, said parity bit value $C0_{0,1}$ is used by said means for using said parity bit value which generates a rotation-defining bit $U0_1$, and said rotation-defining bit $U0_1$ is used in generating a second $(u(1))$ in said pair of 2D points.

19. A modem transmitter according to claim 18, wherein:

said second $(u(1))$ of said pair of 2D points is offset by said second offset value $c(1)$ provided by said offset means to obtain a second offset point $y(1)$, said second offset point $y(1)$ is provided to said convolutional encoder means, said second offset point $y(1)$ is predistorted by said second predistortion value $p(1)$ by said predistortion means to provide a second predistorted output $x(1)$;

said second predistorted output $x(1)$ is used to update said predistortion means which generates a third predistortion value $p(2)$, said third predistortion value is used by said offset means to choose a third offset value $c(2)$, and said first offset point $y(0)$ and said second offset point $y(1)$ are used by said convolutional encoder to provide a redundant bit $Y0_{0,1}$ which is fed to said means for using said parity bit value.

20. A modem transmitter according to claim 19, wherein:

a first $(u(2))$ of another pair of 2D points is offset by said third offset value $c(2)$ provided by said offset means to obtain a third offset point $y(2)$, said third offset point $y(2)$ is provided to said convolutional encoder means, said third offset point $y(2)$ is predistorted by said third predistortion value $p(2)$ by said predistortion means to provide a third predistorted output $x(2)$;

said third predistorted output $x(2)$ is used to update said predistortion means which generates a fourth predistortion value $p(3)$, said fourth predistortion value is used by said offset means to choose a fourth offset value $c(3)$, said third offset value $c(2)$ and said fourth offset value $c(3)$ are used by said parity computation means to generate a parity bit value $C0_{2,3}$, said parity bit value $C0_{2,3}$ is used by said means for using said parity bit value which generates a rotation-defining bit $U0_3$ and said rotation-defining bit $U0_3$ is used in generating a second $(u(0))$ in said another pair of 2D points.

* * * * *

UNITED STATES PATENT AND TRADEMARK OFFICE
CERTIFICATE OF CORRECTION

PATENT NO. : 5,465,273
DATED : November 7, 1995
INVENTOR(S) : Paul Dana Cole

It is certified that error appears in the above-identified patent and that said Letters Patent is hereby corrected as shown below:

Column 5, Line 18
Equation (4) was omitted in the printing of the application.

Please insert:

$$\text{parity}(t_0, t_1) = \begin{cases} 0, & \text{if } t_c - t_1 \text{ is in K} \\ 1, & \text{if } t_0 - t_1 \text{ is not in K} \end{cases} \quad (4)$$

Signed and Sealed this

Twenty-fourth Day of August, 1999

Attest:

Q. TODD DICKINSON

*Attesting Officer*     *Acting Commissioner of Patents and Trademarks*